United States Patent
Higuchi et al.

(10) Patent No.: US 7,266,664 B2
(45) Date of Patent: Sep. 4, 2007

(54) MEMORY DEVICE FOR CONTROLLING NONVOLATILE AND VOLATILE MEMORIES

(75) Inventors: Yoshinobu Higuchi, Kawasaki (JP); Shinji Mizutani, Kawasaki (JP); Keisuke Kanazawa, Kawasaki (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 10/077,778

(22) Filed: Feb. 20, 2002

(65) Prior Publication Data

US 2002/0120820 A1 Aug. 29, 2002

(30) Foreign Application Priority Data

Feb. 28, 2001 (JP) .............. 2001-055104
Jan. 11, 2002 (JP) .............. 2002-004150

(51) Int. Cl.
G06F 12/00 (2006.01)
(52) U.S. Cl. ..................... 711/173; 711/165
(58) Field of Classification Search ....... 711/103, 711/104, 154, 165, 167, 169, 170, 173, 105, 711/111, 112, 113, 114, 171; 714/52, 702; 365/185.11, 185.08, 185.18; 707/200

See application file for complete search history.

(56) References Cited

U.S. PATENT DOCUMENTS

| | | | | |
|---|---|---|---|---|
| 5,121,479 A | * | 6/1992 | O'Brien ................ | 710/34 |
| 5,357,473 A | * | 10/1994 | Mizuno et al. ........ | 365/201 |
| 5,737,342 A | * | 4/1998 | Ziperovich ........... | 714/736 |
| 5,835,935 A | * | 11/1998 | Estakhri et al. ...... | 711/103 |
| 5,946,714 A | * | 8/1999 | Miyauchi ............. | 711/205 |
| 5,987,577 A | * | 11/1999 | Miller et al. ......... | 711/168 |
| 6,272,587 B1 | * | 8/2001 | Irons .................. | 711/103 |
| 6,279,072 B1 | * | 8/2001 | Williams et al. ...... | 711/105 |
| 6,279,135 B1 | * | 8/2001 | Nguyen et al. ....... | 714/769 |
| 6,345,333 B1 | * | 2/2002 | Sassa et al. .......... | 711/103 |
| 6,401,168 B1 | * | 6/2002 | Williams et al. ...... | 711/112 |
| 6,480,969 B1 | * | 11/2002 | Hitz et al. ............ | 714/6 |
| 6,496,455 B1 | * | 12/2002 | Takagi et al. ......... | 369/47.14 |
| 6,591,329 B1 | * | 7/2003 | Kakinuma et al. ..... | 711/103 |
| 6,763,437 B1 | * | 7/2004 | Nguyen et al. ....... | 711/147 |
| 2002/0029316 A1 | * | 3/2002 | Williams et al. ...... | 711/105 |

OTHER PUBLICATIONS

Tanzawa et al., "A Compact On-Chip ECC for Low Cost Flash Memories", © IEEE, p. 662-668.*
Stassinopoulos et al., "Multiple Upset in Memories & Their Impact on Error Predictions and Sybsystem Designs", © 1992 IEEE p. 519-525.*
Chen et al., "A 2.7V only 8Mb×16 NOR Flash Memory", © 1996 IEEE p. 172-173.*
Ishibashi et al., "A 1.-V Adjustable I/O Interface for Low Voltage Fast SRAM's", © 1992 IEEE, p. 674-677.*
Aoki, et al. "A 60-ns 16-Mbit CMOS DRAM with a Transposed DATA-Line Structure", © 1988 IEEE, p. 1113-1119.*
Smith, "Intel's FLEXlogic FPGA Architecture" © 1993 IEEE, p. 378-384.*
Yoon, et al., "A 2.5-V, 333-Mb/s/pin, 1-Gbit, Double-Data-Rate Synchronous DRAM", © 1999 IEEE, p. 1589-1599.*

* cited by examiner

*Primary Examiner*—Brian R. Peugh

(57) ABSTRACT

A memory device includes a nonvolatile memory capable of storing data, a volatile memory capable of being random-accessed, and a controller for transferring data between the nonvolatile memory and the volatile memory and enabling a pseudo access as if the volatile memory were externally directly accessed in accordance with an instruction through an external bus when the data transfer is not performed.

35 Claims, 13 Drawing Sheets

F I G. 12
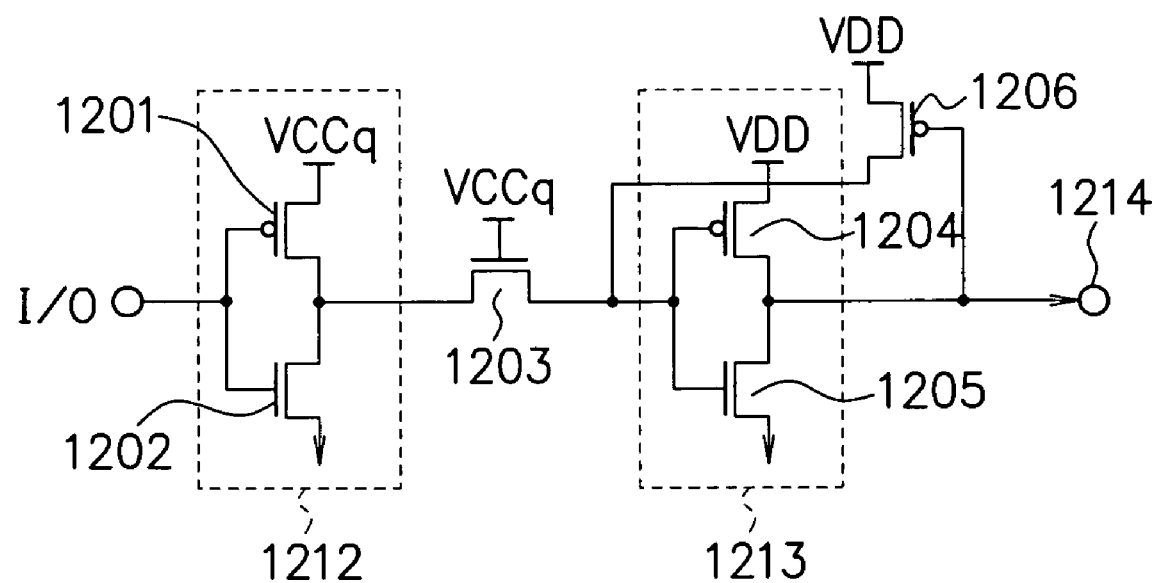

MEMORY DEVICE FOR CONTROLLING NONVOLATILE AND VOLATILE MEMORIES

CROSS-REFERENCE TO RELATED APPLICATIONS

This application is based upon and claims priority of Japanese Patent Application Nos. JP2001-055104, filed on Feb. 28, 2001 and JP2002-004150, filed on Jan. 11, 2002, the contents being incorporated herein by reference.

BACKGROUND OF THE INVENTION

1. Field of the Invention

The present invention relates to memory devices, in particular, including nonvolatile and volatile memories.

2. Description of the Related Art

FIG. 9 is a block diagram showing the construction of a conventional memory device. A microcontroller 901 is connected to a nonvolatile memory (NV memory) 905 through a bus and to a RAM 906, an error correction circuit 903, and a nonvolatile memory 902 through another bus. The nonvolatile memory 902 is a NOR flash memory, and the nonvolatile memory 905 is a NAND flash memory.

The NOR flash memory 902 can be random-accessed. For this reason, the microcontroller 901 can directly access the NOR flash memory 902 through the bus. However, the NOR flash memory 902 is disadvantageous because of its small capacity, large size, and high power consumption.

To cope with these problems, the NAND flash memory 905 having advantages such as a large capacity, small size, and low power consumption is added to the memory device. However, the NAND flash memory 905 can only be sequentially accessed and therefore requires the RAM 906 to enable a random access. That is, the microcontroller 901 sequentially transfers data from the NAND flash memory 905 to the RAM 906, and thereafter random access to the RAM 906 is possible.

Although the NAND flash memory 905 has the above advantages, it requires the error detection and correction circuit 903 because data reliability is low. The error detection and correction method will be described next.

FIG. 10 is a block diagram showing the error detection and correction method in the memory device shown in FIG. 9. The microcontroller 901 includes a buffer 1001.

A method for the microcontroller 901 transferring data from the RAM 906 to the NAND flash memory 905 will be described. First, the microcontroller 901 reads out actual data (512 bytes) 1014 from the RAM 906 to the buffer 1001 and supplies actual data 1012 to the error detection and correction circuit (EGC) 903. The error detection and correction circuit 903 generates error detection and correction data (3 bytes) 1013 on the basis of the actual data (512 bytes) 1012. The microcontroller 901 reads out the error detection and correction data 1013 to the buffer 1001 and writes the actual data and error detection and correction data (512+3 bytes) 1011 in the NAND flash memory 905.

The NAND flash memory 905 has a storage area of a plurality of pages. Each page has an actual data area and a spare data area. The actual data is stored in the actual data area, and the error detection and correction data is stored in the spare data area.

A method for the microcontroller 901 transferring data from the NAND flash memory 905 to the RAM 906 will be described next. The microcontroller 901 reads out the actual data and error detection and correction data (512+3 bytes) 1011 from the NAND flash memory 905 to the buffer 1001. Next, the microcontroller 901 supplies the actual data (512 bytes) 1012 in the buffer 1001 to the error detection and correction circuit 903. The error detection and correction circuit 903 generates the error detection and correction data (3 bytes) 1013 on the basis of the actual data 1012. The microcontroller 901 reads out the error detection and correction data 1013 and checks whether or not the error detection and correction data 1013 is the same as the error detection and correction data previously read out from the NAND flash memory 905. When the two data are the same, it means that the actual data in the buffer 1001 has no error. When the two data are not the same, it means that the actual data in the buffer 1001 has an error.

If the actual data has no error, the microcontroller 901 writes the actual data 1014 in the buffer 1001 into the RAM 906 without any change. If the actual data has an error, the microcontroller 901 specifies the error bit in accordance with the check result, corrects the actual data in the buffer 1001, and writes the corrected actual data 1014 into the RAM 906.

FIG. 11 is a representation of a NAND flash memory 1101 and the RAM 1111 for illustrating the concept of the above error detection and correction method. The NAND flash memory 1101 includes pages 1102, 1103, 1104, and so on. Each of the pages 1102 to 1104 has an actual data area and spare data area. The actual data area is for storing actual data, and the spare data area is for storing spare data (including error detection and correction data). Each page is for actual data of, e.g., 512 bytes and error detection and correction data of, e.g., 3 bytes.

Data transfer from the RAM 1111 to the NAND flash memory 1101 will be described first. The RAM 1111 stores actual data 1112. A microcontroller 1121 makes the actual data 1112 (e.g., 512 bytes) in the RAM 1111 one-to-one-correspond to spare data 1122 (e.g., 3 bytes) in the internal buffer of the microcontroller 1121 and writes actual data 1152 and spare data 1151 in the NAND flash memory 1101.

Data transfer from the NAND flash memory 1101 to the RAM 1111 will be described next. The NAND flash memory 1101 stores actual data and spare data. The microcontroller 1121 reads out actual data 1141 and spare data 1142 from the NAND flash memory 1101. Only the actual data 1141 is written in the RAM 1111 as the actual data 1112, and the spare data 1142 is deleted as delete data 1131 without being stored in the RAM 1111.

The spare data stored in the NAND flash memory 1101 contains not only the above error detection and correction data but also management information and control information. Hence, to correct the actual data, the spare data must be corrected accordingly.

To correct actual data on the RAM 1111 and write the data in the NAND flash memory 1101, the microcontroller 1121 temporarily reads out spare data from the NAND flash memory 1101 and corrects the spare data. Then, the microcontroller 1121 writes the corrected spare data and the corrected actual data on the RAM 1111 in the NAND flash memory 1101. As described above, to correct spare data, the data must be temporarily read out from the NAND flash memory 1101. For this reason, the number of processing steps is large, and the processing speed is low.

As described above, in the memory device including the NAND flash memory 905, data transfer between the NAND flash memory 905 and the RAM 906 is necessarily performed. During this data transfer, the bus connecting the microcontroller 901 with the RAM 906 is occupied, as shown in FIG. 9, so the microcontroller 901 cannot access the NOR flash memory 902.

Besides, as shown in FIG. 10, upon data transfer between the NAND flash memory 905 and the RAM 906, at least four data transfer processes 1011 to 1014 must be executed. This means that the data transfer requires a long time.

Besides, the buffer 1001 in the microcontroller 901 requires a memory capacity of at least 512+3 bytes to read/write actual data (512 bytes) and error detection and correction data (3 bytes) from/in the NAND flash memory 905.

Besides, since the NAND flash memory 905 and the RAM 906 have different electrical specifications, the microcontroller 901 must control the NAND flash memory 905 and the RAM 906 using power supply voltages corresponding to the respective electrical specifications. For this reason, the microcontroller 901 can not use its original low power supply voltage, and so low power consumption cannot be realized.

As shown in FIG. 11, to correct spare data in the NAND flash memory 1101, the spare data must be temporarily read out from the NAND flash memory 1101. For this reason, the number of processing steps is large, and the processing speed is low.

SUMMARY OF THE INVENTION

It is an object of the present invention to provide a memory device which allows an access to a NOR flash memory (nonvolatile memory) even during data transfer between a NAND flash memory (nonvolatile memory) and a RAM (volatile memory).

It is another object of the present invention to provide a memory device capable of high-speed data transfer between a NAND flash memory and a RAM.

It is still another object of the present invention to provide a memory device capable of decreasing the buffer capacity in the controller for controlling data transfer between a NAND flash memory and a RAM.

It is still another object of the present invention to provide a memory device capable of determining the electrical specifications of the controller independently of the electrical specifications of a NAND flash memory and a RAM.

It is still another object of the present invention to provide a memory device capable of correcting and writing spare data in a NAND flash memory at a high speed.

According to the present invention, a memory device comprises a nonvolatile memory capable of storing data, a volatile memory capable of being random-accessed, and a controller for transferring data between the nonvolatile memory and the volatile memory and enabling a pseudo access as if the volatile memory were externally directly accessed in accordance with an instruction through an external bus when the data transfer is not executed.

The controller can execute data transfer between the nonvolatile memory and the volatile memory in response to an instruction from an external controller. During this data transfer, the external bus is not occupied. Hence, the external controller can access another memory (e.g., a NOR flash memory) through the external bus even during the data transfer. In addition, the external controller can make a pseudo access as if the volatile memory were directly accessed through the controller according to the present invention.

BRIEF DESCRIPTION OF THE DRAWINGS

FIG. 12 is a circuit diagram showing a configuration example of a voltage level conversion circuit.

DETAILED DESCRIPTION OF THE PREFERRED EMBODIMENTS

Figure 1:
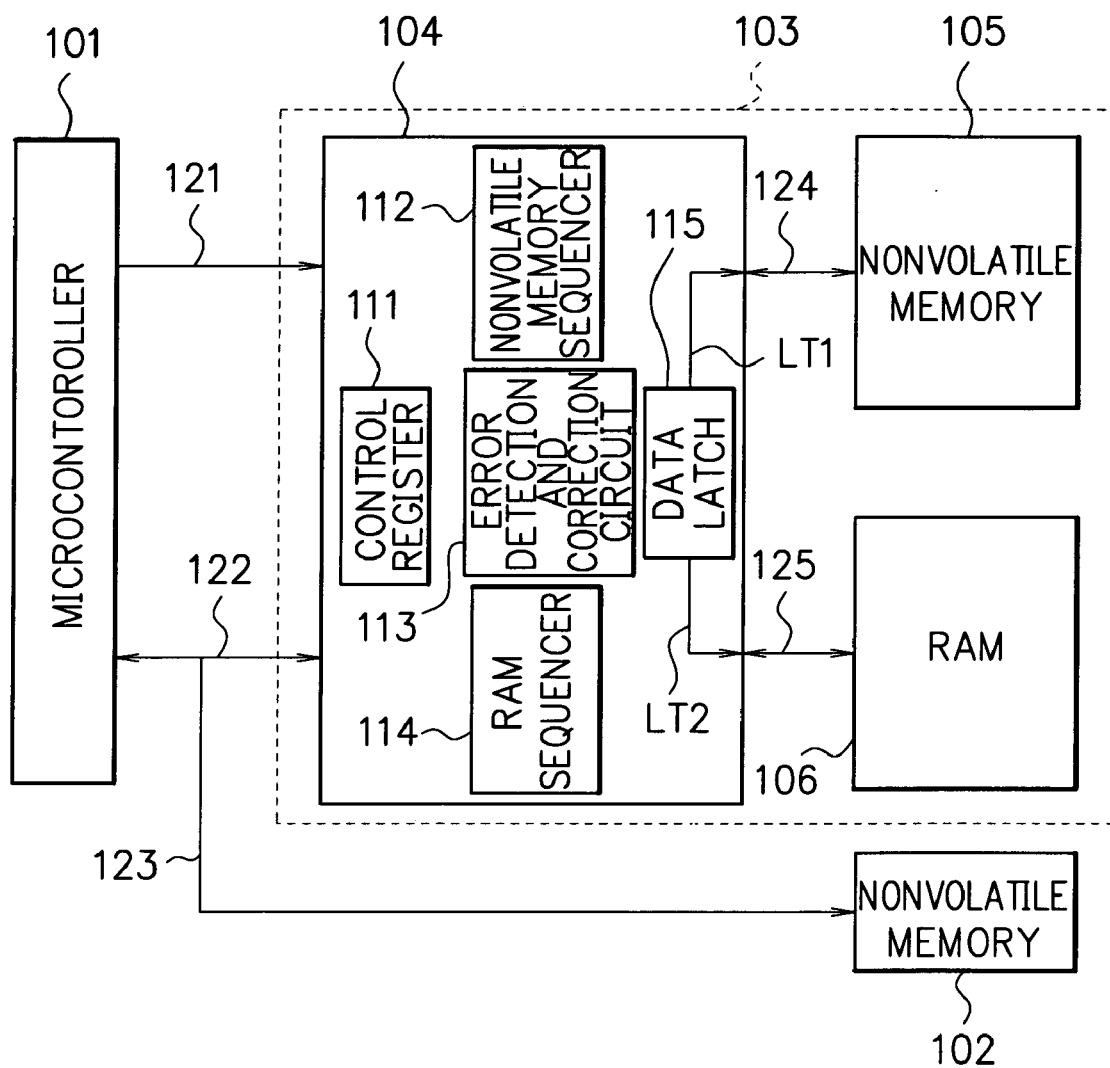
FIG. 1 is a block diagram showing the construction of a memory device according to an embodiment of the present invention.

FIG. 1 is a block diagram showing the construction of a memory device according to an embodiment of the present invention.

A microcontroller 101 is connected to an internal controller 104 through external buses 121 and 122. The external bus 121 is a controller control signal line, and the external bus 122 is a RAM interface line 122.

The internal controller 104 is connected to a nonvolatile memory (NV memory) 105 through a memory bus 124 and to a RAM 106 through a memory bus 125. The nonvolatile memory 105 is, e.g., a NAND flash memory. The RAM 106 is, e.g., an SRAM (Static Random Access Memory). The memory bus 124 is a NAND flash memory interface bus. The memory bus 125 is a RAM interface bus. The internal controller 104, the NAND flash memory 105, and the RAM 106 are incorporated in a single package 103.

The internal controller 104 includes a control register 111, a NAND flash memory sequencer 112, an error detection and correction circuit 113, a RAM sequencer 114, and a data latch 115. The control register 111 will be described later with reference to FIG. 2. The NAND flash memory sequencer 112 can control the NAND flash memory 105 through the memory bus 124. The RAM sequencer 114 can control the RAM 106 through the memory bus 125. The error detection and correction circuit 113 executes error detection and correction processing. The data latch 115 can buffer data having an arbitrary data length (e.g., one word) equal to or less than the page size in data transfer between the NAND flash memory 105 and the RAM 106.

The microcontroller 101 is also connected to a nonvolatile memory (NV memory) 102 through an external bus 123. The external buses 122 and 123 are connected to the microcontroller 101 through a common bus. The nonvolatile memory 102 is, e.g., a NOR flash memory.

The NOR flash memory 102 can be random-accessed. For this reason, the microcontroller 101 can directly access the NOR flash memory 102 through the bus 123. However, the NOR flash memory 102 is disadvantageous because of its small capacity, large size, and high power consumption.

To cope with these problems, the NAND flash memory 105 having advantages such as a large capacity, small size, and low power consumption is added to the memory device. However, the NAND flash memory 105 can only be sequentially accessed and therefore requires the RAM 106 to enable random access. Besides, although the NAND flash memory 105 has the above advantages, it requires the error detection and correction circuit 113 because data reliability is low.

Figure 7:
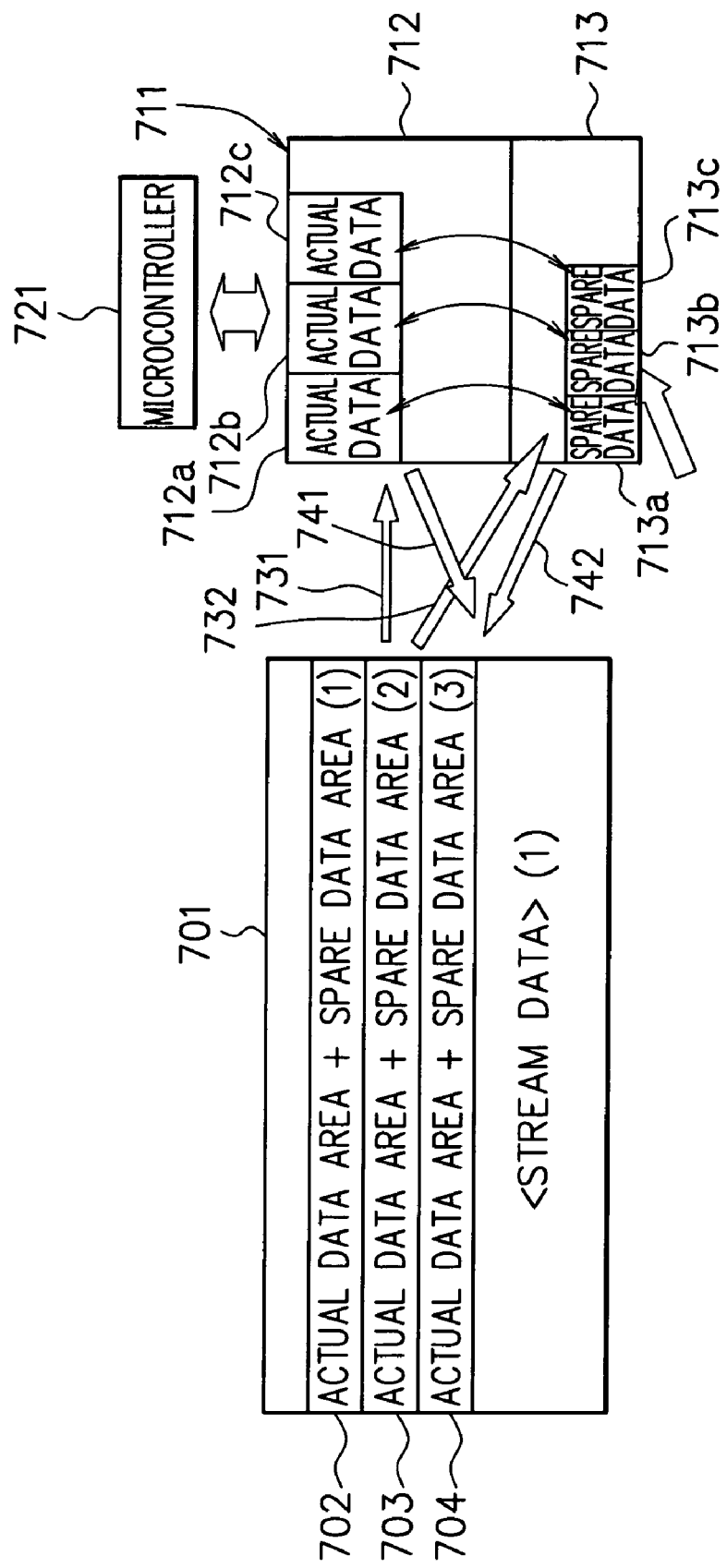
FIG. 7 is a representation of a data transfer method between the NAND flash memory and the RAM according to the embodiment.

As shown in FIG. 7, a NAND flash memory 701 includes pages 702, 703, 704, and so on. Each of the pages 702 to 704 has an actual data area and a spare data area. The actual data area is for storing actual data, and the spare data area is for storing spare data. In each page, the actual data area is for, e.g., 512 words and the spare data area is for, e.g., 16 words. In the spare data area, the first eight words are for storing control information and management information, and the second eight words are for storing error detection and correction data. The error detection and correction data is formed from, e.g., 3 words.

Figure 2:
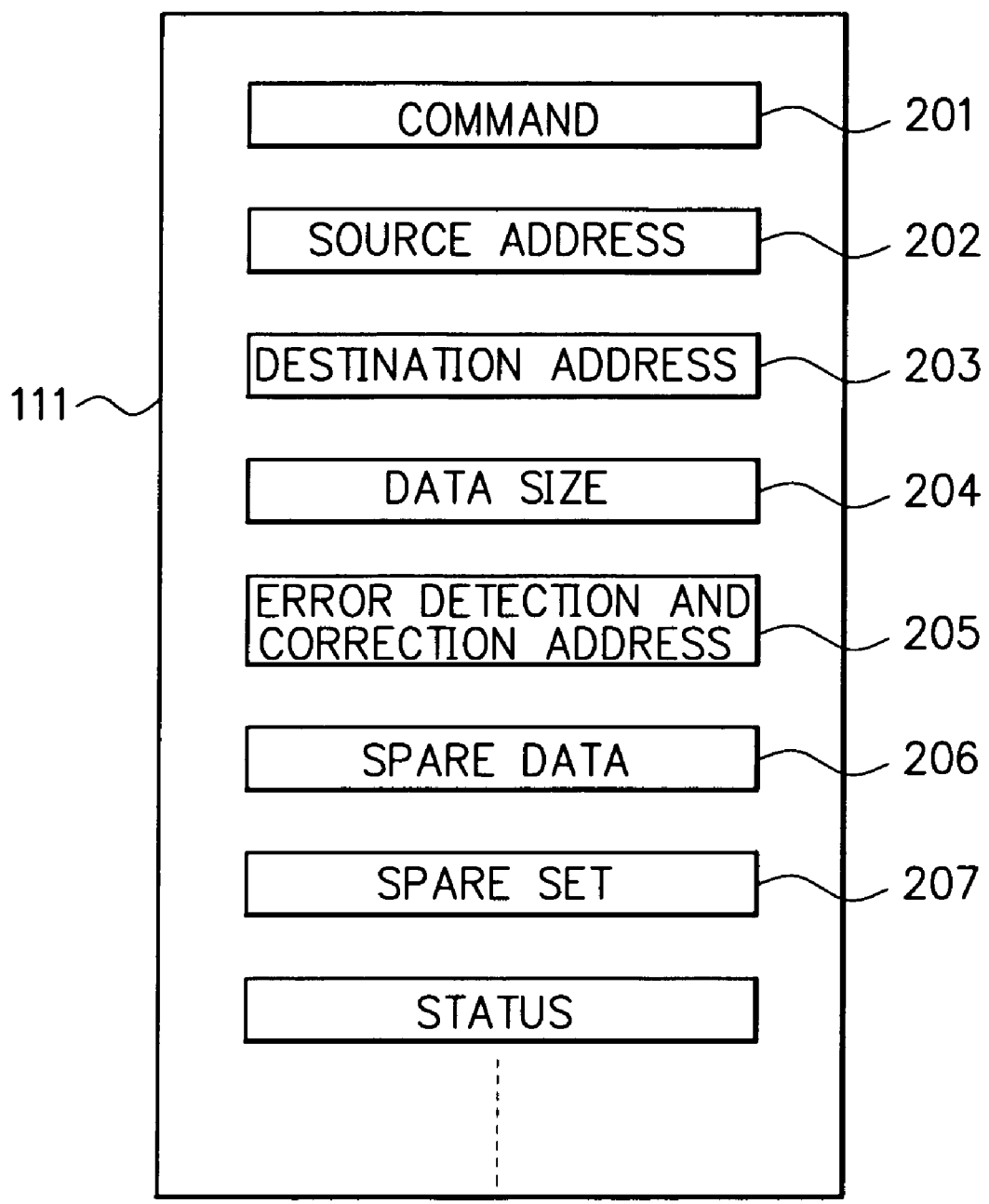
FIG. 2 is a representation of the contents of a control register.

FIG. 2 shows the construction of the control register 111. The control register 111 includes a command register 201, a source address register 202, a destination address register 203, a data size register 204, an error detection and correction address register 205, a spare data register 206, a spare set register 207, a status register 208, etc.

The command register 201 stores a command received from the microcontroller 101 through the external bus 122. Examples of commands are, e.g., a save command, a load command, a suspend command, and a resume command. The save command is issued to transfer data from the RAM 106 to the NAND flash memory 105. The load command is issued to transfer data from the NAND flash memory 105 to the RAM 106. The suspend command is issued to temporarily stop data transfer between the NAND flash memory 105 and the RAM 106, which is commanded by the above save or load command. The resume command is issued to resume the temporarily stopped data transfer.

The source address register 202 stores a source address that indicates the transfer source of the above-mentioned data transfer. The destination address register 203 stores a destination address that indicates the transfer destination of the data transfer. The data size register 204 stores the data size of the data transfer.

When the error detection and correction circuit 113 detects an error, the error detection and correction address register 205 stores the address of the data including the detected error.

The spare data register 206 stores spare data to be written in the NAND flash memory 105. The spare set register 207 indicates whether or not the spare data stored in the spare data register 206 is to be written in the NAND flash memory 105.

The status register 208 indicates the state of the internal controller 104 or the like.

Figure 3:
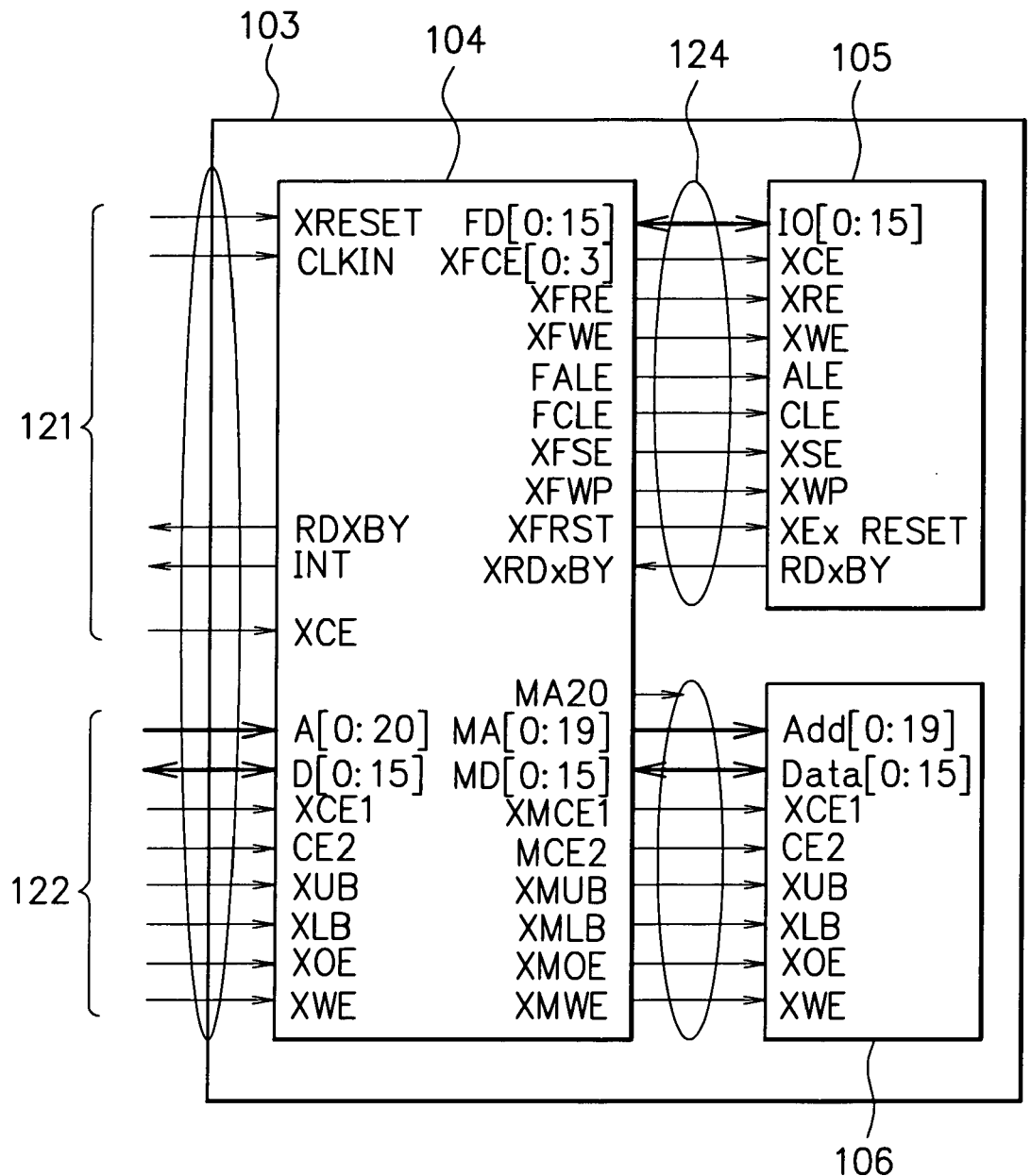
FIG. 3 is a diagram showing the connections between an internal controller, a NAND flash memory, and a RAM.

FIG. 3 shows the connection states of the terminal pins of the internal controller 104, the NAND flash memory 105, and the RAM 106 of FIG. 1. The controller control signal line 121 and the RAM interface line 122 are connected to the internal controller 104.

The internal controller 104 has the following terminals connected to the controller control signal line 121. A terminal XRESET is a reset input terminal for externally resetting the controller. A terminal CLKIN is an external clock input terminal. A terminal RDXBY is a ready/busy output terminal. A terminal INT is an interrupt signal output terminal for outputting an interrupt signal indicating, e.g., that the data transfer has ended. A terminal XCE is a chip enable input terminal.

The internal controller 104 also has the following general RAM terminals connected to the RAM interface line 122. A terminal A is an address input terminal which can also designate addresses of the RAM 106 and a register in the control register 111 (FIG. 2). A terminal D is a data input/output terminal. A terminal XCE1 is a first chip enable input terminal. A terminal CE2 is a second chip enable input terminal. The chip enable and operation mode can be designated by combining the chip enable input terminals XCE1 and CE2. A terminal XUB is an input terminal for enabling the upper eight bits of the 16 bits of the data terminal D. A terminal XLB is an input terminal for enabling the lower eight bits of the 16 bits of the data terminal D. A terminal XOE is an output (read) enable input terminal. A terminal XWE is a write enable input terminal.

The internal controller 104 also has the following general RAM terminals connected to the memory bus 125 in accordance with the terminals connected to the bus 122. That is, the bus 125 has terminals MA, MD, XMCE1, MCE2, XMUB, XMLB, XMOE, and XMWE.

The RAM 106 has terminals Add, Data, XCE1, CE2, XUB, XLB, XOE, and XWE corresponding to the terminals of the opposite internal controller 104 connected through the bus 125.

As described above, since the buses 122 and 125 are commonly used as RAM interfaces, the microcontroller 101 (FIG. 1) can make a pseudo access as if it externally directly accessed to the RAM 106 in accordance with an instruction through the external bus 122.

The internal controller 104 also has the following terminals connected to the memory bus 124. A terminal FD is a data input/output terminal. A terminal XFCE is a chip enable output terminal. A terminal XFRE is a read enable output terminal. A terminal XFWE is a write enable output terminal. A terminal FALE is an address latch enable output terminal. A terminal FCLE is a command latch enable output terminal. When the terminals FALE and FCLE are not selected, data appears on the output IO bus. A terminal XFSE is a spare area enable output terminal which enables the spare data area of the NAND flash memory 105. A terminal XFWP is a write protect output terminal. A terminal XFRST is an external reset output terminal. A terminal XRDxBY is a ready/busy input terminal.

The NAND flash memory 105 has terminals IO, XCE, XRE, XWE, ALE, CLE, XSE, XWP, XEx_RESET, and RDxBY corresponding to the terminals of the opposite internal controller 104 connected through the bus 124.

A method for the microcontroller 101 transferring data from the RAM 106 to the NAND flash memory 105 will be described next with reference to FIG. 1. The microcontroller 101 stores a save command in the command register 201 shown in FIG. 2, the start address of the RAM 106 as the transfer source in the source address register 202, the start address of the NAND flash memory 105 as the transfer destination in the destination address register 203, and the transfer data size in the data size register 204.

The internal controller 104 then transfers actual data (512 words) from the RAM 106 to the NAND flash memory 105 through the data latch 115 and the error detection and correction circuit 113. Attendant upon the data transfer, the source address register 202 and the destination address register 203 are incremented, and the data size register 204 is decremented.

The error detection and correction circuit 113 generates error detection and correction data (3 words) on the basis of the actual data. When the actual data is completely written in the actual data area of the NAND flash memory 105, the internal controller 104 then writes spare data including the generated error detection and correction data in the spare area of the NAND flash memory 105.

A method for the microcontroller 101 transferring data from the NAND flash memory 105 to the RAM 106 will be described next. The microcontroller 101 stores a load command in the command register 201 shown in FIG. 2, the start address of the NAND flash memory 105 as the transfer source in the source address register 202, the start address of the RAM 106 as the transfer destination in the destination address register 203, and the transfer data size in the data size register 204.

The internal controller 104 then transfers actual data (512 words) from the NAND flash memory 105 to the RAM 106 through the data latch 115 and the error detection and correction circuit 113. Attendant upon the data transfer, the source address register 202 and the destination address register 203 are incremented, and the data size register 204 is decremented.

The error detection and correction circuit 113 generates error detection and correction data (3 words) on the basis of the actual data. When the actual data is completely read out from the actual data area of the NAND flash memory 105, the internal controller 104 then reads out spare data (including the error detection and correction data) from the spare data area of the NAND flash memory 105. The internal controller 104 compares the read-out error detection and correction data with the error detection and correction data generated by the error detection and correction circuit 113. If the two data are the same, it means that the transferred actual data includes no error. If the two data are not the same, it means that the transferred actual data includes an error.

If the data includes no error, the actual data on the RAM 106 need not be corrected. If the data includes an error, the address of the data with the error on the RAM 106 is specified on the basis of the comparison result and stored in the error detection and correction address register 205. The microcontroller 101 reads out the data at the address with the error from the RAM 106, inverts the data bits of the data at the address on the basis of the address in the error detection and correction address register 205, and writes the data again in the RAM 106. Thus, correction processing for the actual data on the RAM 106 is completed.

Likewise, data transfer of the next page is continued until the data size register 204 becomes zero. The microcontroller 101 is notified of the end of the data transfer through the terminal INT of the internal controller 104 as an interrupt signal.

The internal controller 104 can perform the above data transfer without affecting the external bus 122. Hence, after the microcontroller 101 instructs the internal controller 104 to perform data transfer, while the data transfer is being executed, the external buses 122 and 123 are not occupied for the data transfer. Even during the data transfer, the external bus 123 is free, so the microcontroller 101 can access the NOR flash memory 102 through the external bus 123 under the multi-task environment (OS).

Besides, even during the data transfer, the microcontroller 101 can access the RAM 106. More specifically, the microcontroller 101 can temporarily stop the data transfer by sending a suspend command to the internal controller 104 during the data transfer between the NAND flash memory 105 and the RAM 106. After that, the microcontroller 101 can access the RAM 106 through the internal controller 104 by the RAM interface. Then, the microcontroller 101 can resume the data transfer by sending a resume command to the internal controller 104. The resume can be executed using the data left in the source address register 202, the destination address register 203, and the data size register 204 of FIG. 2.

Figure 4:
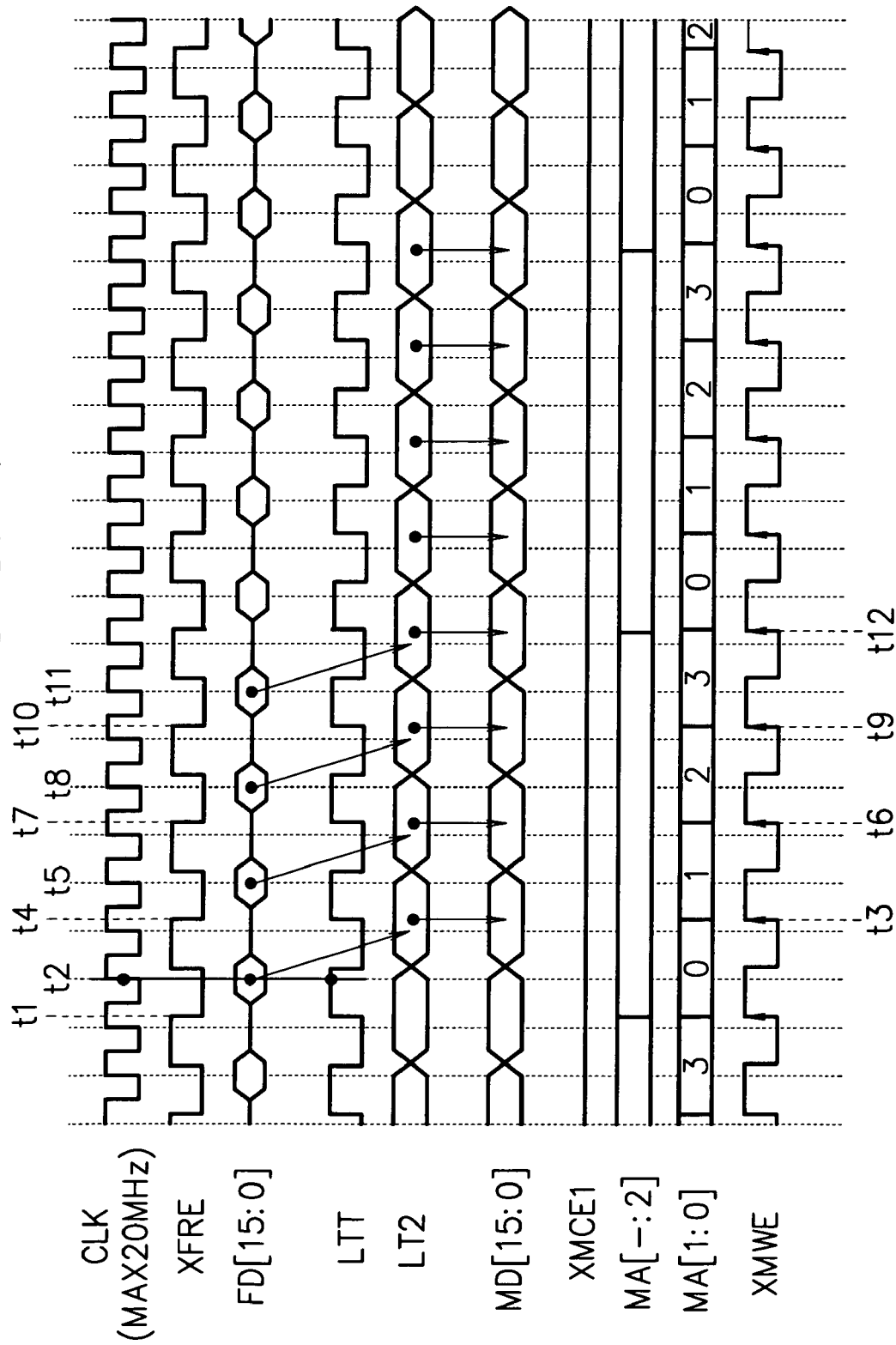
FIG. 4 is a timing chart showing the transfer timings from the NAND flash memory to the RAM.

FIG. 4 is a timing chart showing the timings of data transfer from the NAND flash memory 105 to the RAM 106. A clock signal CLK is the operation clock for the internal controller 104. A read enable signal XFRE is a read enable signal for the NAND flash memory 105. Data FD is data in the NAND flash memory 105. An internal latch timing signal LTT is a latch signal for one word for the data latch 115 (FIG. 1). A latch output LT2 is the output from the data latch 115 to the RAM 106.

Data MD is data in the RAM 106. A chip enable signal XMCE1 is a chip enable signal for the RAM 106. An address MA is an address signal for the RAM 106, whose lower two bits repeat "0", "1", "2", and "3" as the address is incremented. A write enable signal XMWE is a write enable signal for the RAM 106.

At time t1, the read enable signal XFRE falls, and the data FD is read out from the NAND flash memory 105.

At time t2, the internal latch timing signal LTT goes high, and the clock CLK rises. The data FD is latched by the data latch 115, and the latch output LT2 is output. The latch output LT2 is output as the data MD.

At time t3, the write enable signal XMWE rises, and the data MD is written in the RAM 106. The first data transfer of one word is then completed.

At time t4, the read enable signal XFRE falls, and the next data FD is read out from the NAND flash memory 105.

At time t5, the internal latch timing signal LTT goes high, and the clock CLK rises. The data FD is latched by the data latch 115, and the latch output LT2 is output as the data MD.

At time t6, the write enable signal XMWE rises, and the data MD is written in the RAM 106. The second data transfer of one word is then completed.

In a similar manner, the third data transfer of one word is performed at times t7 to t9, and the fourth data transfer of one word is performed at times t10 to t12.

As described above, in data transfer between the NAND flash memory 105 and the RAM 106, before the plurality of data are completely read out from the NAND flash memory 105 or RAM 106, the write of the plurality of data in the RAM 106 or NAND flash memory 105 is started.

To perform the above data transfer, the internal controller 104 includes the data latch (buffer) 115 for buffering data of one word and executes the data transfer through the data latch 115.

The internal controller 104 can transfer data in a time obtained by adding one transfer cycle to a time obtained by multiplying the transfer cycle by the number of transfer data. The transfer cycle at this time corresponds to two periods of the clock CLK.

Figure 5:
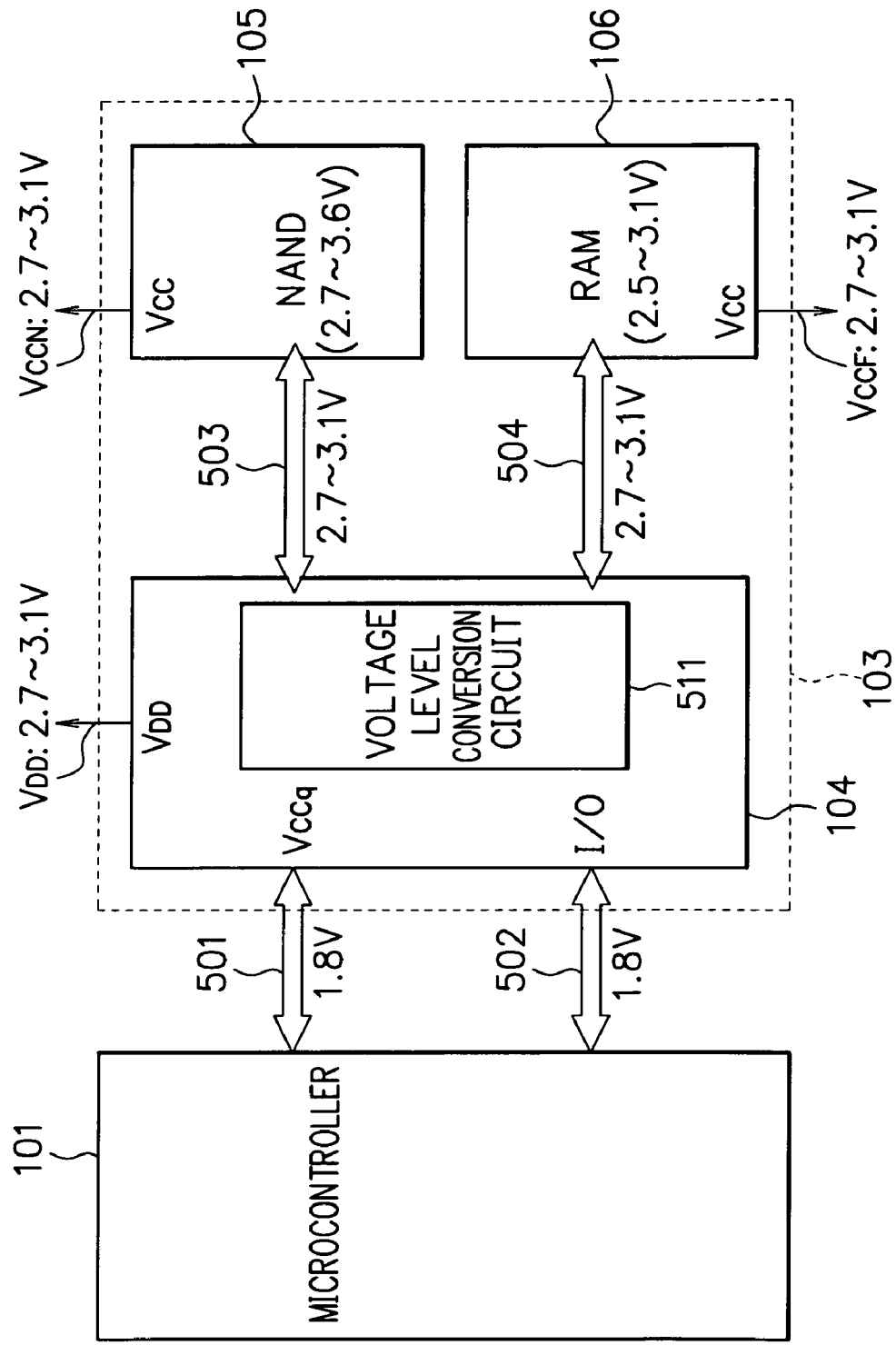
FIG. 5 is a block diagram for illustrating input/output voltage levels.

FIG. 5 shows power supply levels used in the memory device. The NAND flash memory 105 and the RAM 106 have different electrical specifications, so their operable input/output voltage levels are also different. The operable input/output voltage level of the NAND flash memory 105 is 2.7 to 3.6 V, while the operable input/output voltage level of the RAM 106 is 2.5 to 3.1 V.

Figure 9:
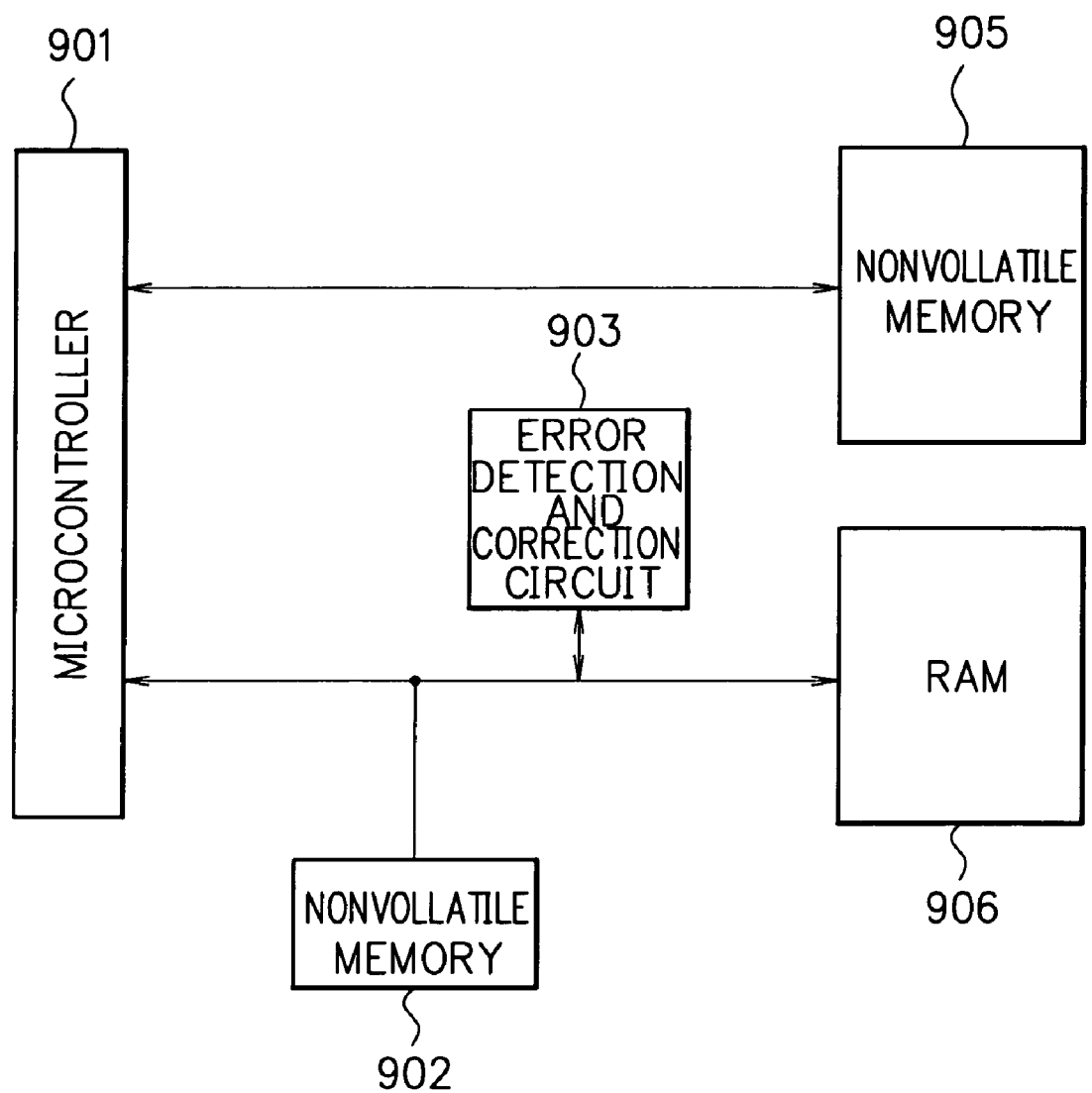
FIG. 9 is a block diagram showing the construction of a conventional memory device.
Figure 10:
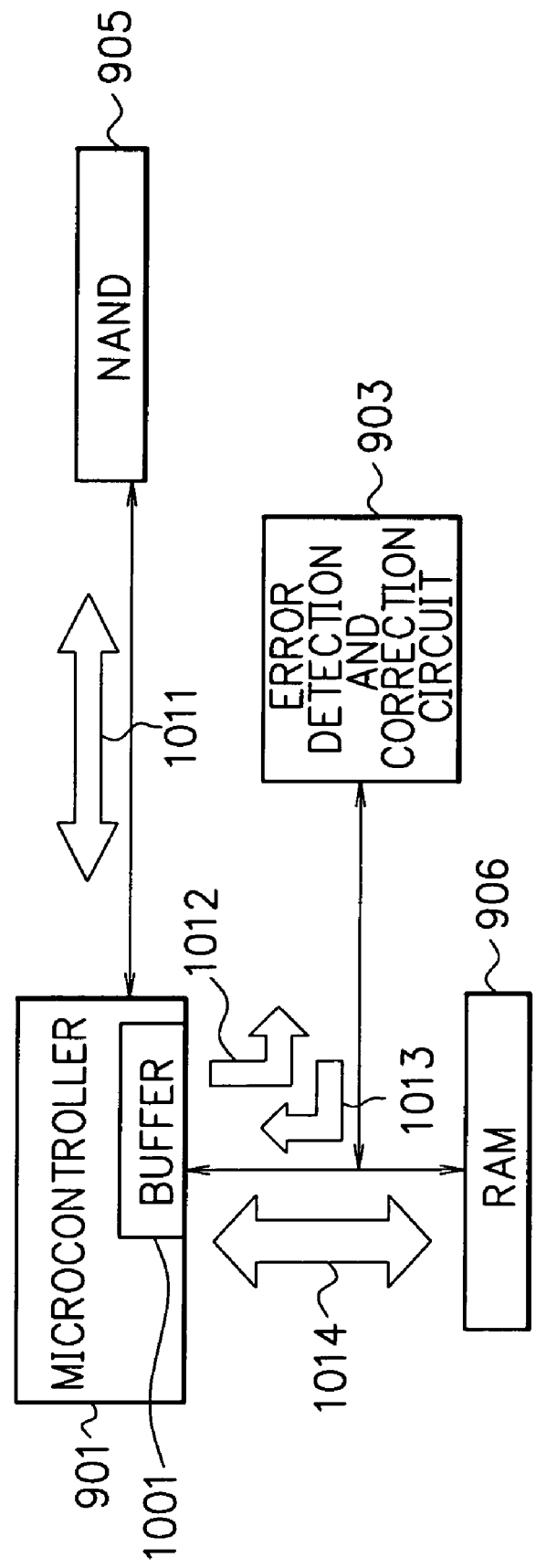
FIG. 10 is a representation of a conventional error detection and correction method.

In the conventional memory device shown in FIG. 9, when the two memories 905 and 906 use different operable input/output voltage levels, the microcontroller 901 must control them on the basis of two power supplies corresponding to the two memories. For this reason, the requirement to employ a low power supply voltage of, e.g., 1.8 V for the microcontroller 901 cannot be met.

In this embodiment, the internal controller 104 accesses the two memories 105 and 106 using a voltage of 2.7 to 3.1 V within the overlap range of the operable input/output voltage levels of the NAND flash memory 105 and the RAM 106. That is, the voltage level of an input/output 503 between the internal controller 104 and the NAND flash memory 105 is 2.7 to 3.1 V, and the voltage level of an input/output 504 between the internal controller 104 and the RAM 106 is also 2.7 to 3.1 V. A voltage VCCN of 2.7 to 3.1 V is supplied to a power supply terminal VCC of the NAND flash memory 105. A voltage VCCF of 2.7 to 3.1 V is supplied to the power supply terminal VCC of the RAM 106.

To realize low power consumption, the microcontroller 101 executes input/output to/from the internal controller 104 at an input/output voltage level of 1.8 V based on, e.g., a low power supply voltage of, e.g., 1.8 V. That is, the microcontroller 101 supplies an input/output power supply of 1.8 V to an input/output power supply terminal VCCq of the internal controller 104 through a power supply line 501 and executes input/output at the input/output voltage level of 1.8 V to/from an input/output terminal I/O of the internal controller 104 through an input/output line 502.

The internal controller 104 includes a voltage level conversion circuit 511 and inputs a voltage VDD of 2.7 to 3.1 V to the power supply terminal VDD to control the inputs/outputs 503 and 504. The voltage level conversion circuit 511 controls the inputs/outputs 503 and 504 to/from the two memories 105 and 106 on the basis of the power supply terminal VDD of 2.7 to 3.1 V and controls the input/output 502 to/from the microcontroller 101 on the basis of the input/output power supply terminal VCCq of 1.8 V. That is, the voltage level conversion circuit 511 converts the voltage level between the input/output voltage level (1.8 V) for the microcontroller 101 and the input/output voltage level (2.7 to 3.1 V) for the two memories 105 and 106.

As described above, since the input/output voltage level of the microcontroller 101 can be determined independently of the two memories 105 and 106 having different electrical specifications, a single low voltage (1.8 V) can be employed as the power supply voltage of the microcontroller 101.

In the above example, the operable input/output voltage levels of the NAND flash memory 105 and the RAM 106 overlap. A case wherein the operable input/output voltage levels of the two memories 105 and 106 are different and do not overlap will be described next.

Figure 6:
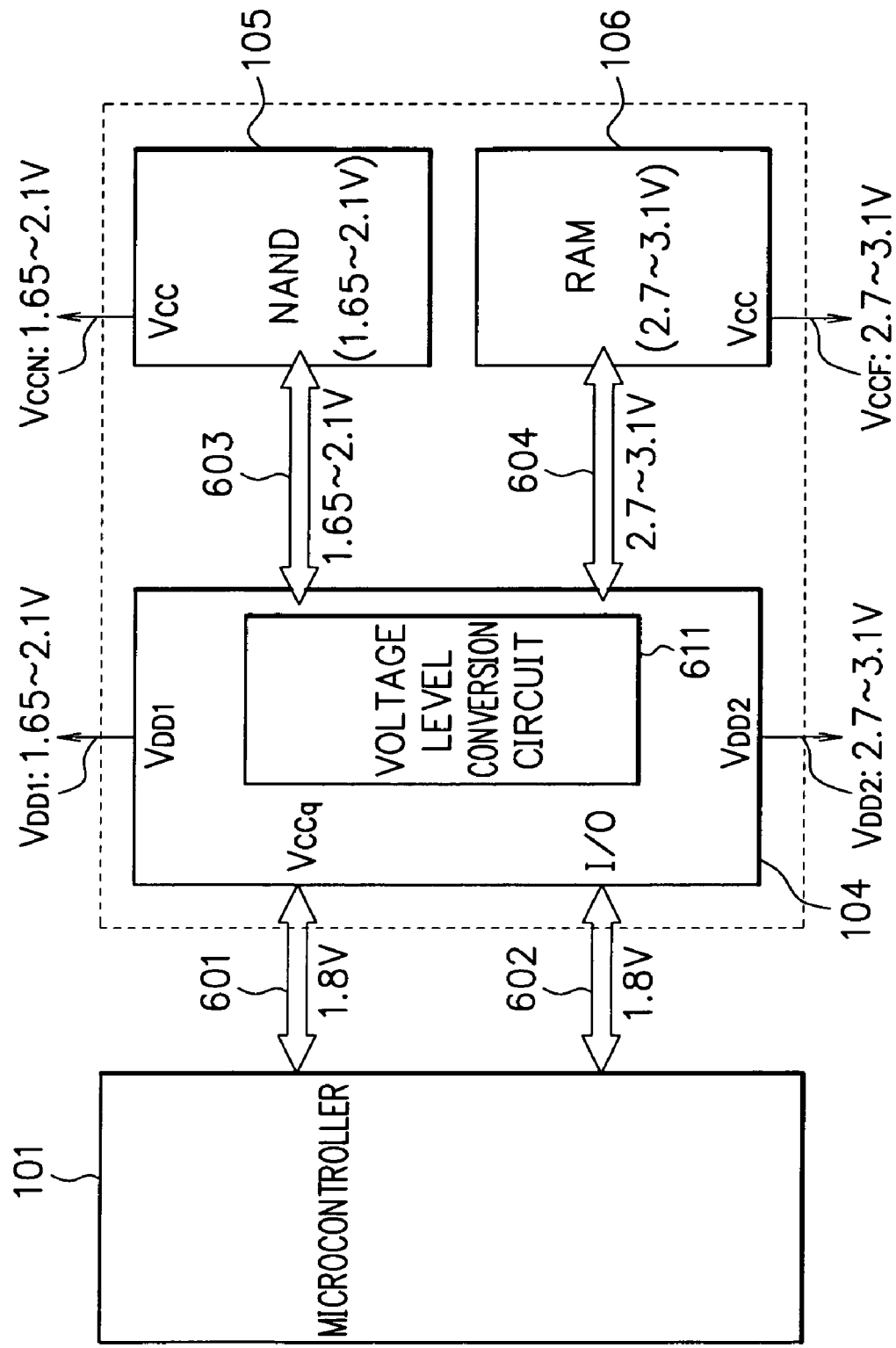
FIG. 6 is a block diagram for illustrating another example of input/output voltage levels.

FIG. 6 shows a case wherein the two memories 105 and 106 have different input/output voltage level ranges. The NAND flash memory 105 and the RAM 106 have different electrical specifications and use different operable input/output voltage level ranges that do not overlap. For example, the operable input/output voltage level of the NAND flash memory 105 is 1.65 to 2.1 V, and that of the RAM 106 is 2.7 to 3.1 V.

Like the case of FIG. 5, the microcontroller 101 supplies an input/output power supply of 1.8 V to the input/output power supply terminal VCCq of the internal controller 104 through a power supply line 601 and executes input/output at the input/output voltage level of 1.8 V to/from the input/output terminal I/O of the internal controller 104 through an input/output line 602.

The internal controller 104 includes a voltage level conversion circuit 611, inputs a voltage VDD1 of 1.65 to 2.1 V to the power supply terminal VDD1 for controlling an input/output 603, and inputs a voltage VDD2 of 2.7 to 3.1 V to a power supply terminal VDD2 for controlling an input/output 604. The voltage level conversion circuit 611 controls the input/output 603 to/from the NAND flash memory 105 on the basis of the power supply terminal VDD1 of 1.65 to 2.1 V, controls the input/output 604 to/from the RAM 106 on the basis of the power supply terminal VDD2 of 2.7 to 3.1 V, and controls the input/output 602 to/from the microcontroller 101 on the basis of the input/output power supply terminal VCCq of 1.8 V. That is, the voltage level conversion circuit 611 converts the voltage level between the inputs/outputs 602, 603, and 604.

The internal controller 104 can access the NAND flash memory 105 and the RAM 106 using different input/output voltage levels that do not overlap. That is, the voltage level of the input/output 603 between the internal controller 104 and the NAND flash memory 105 is 1.65 to 2.1 V, and that of the input/output 604 between the internal controller 104 and the RAM 106 is 2.7 to 3.1 V. The voltage VCCN of 1.65 to 2.1 V is supplied to the power supply terminal VCC of the NAND flash memory 105, and the voltage VCCF of 2.7 to 3.1 V is supplied to the power supply terminal VCC of the RAM 106.

As described above, when the operable input/output voltage levels of the NAND flash memory 105 and the RAM 106 are different and do not overlap, the two memories can be accessed using different input/output voltage levels that do not overlap, by using the two power supply terminals VDD1 and VDD2 provided in the internal controller 104.

Even when the operable input/output voltage levels of the two memories 105 and 106 overlap, the two memories 105 and 106 may be accessed using different input/output voltage levels that doe not overlap.

FIG. 12 is a circuit diagram showing a configuration example of the voltage level conversion circuit 511 in FIG. 5.

First, a configuration of a voltage level conversion circuit 511 will be explained. An input terminal I/O is connected to an inverter 1212. The inverter 1212 includes a p-channel MOS transistor 1201 and an n-channel MOS transistor 1202. The p-channel MOS transistor 1201 has a gate being connected to the input terminal I/O and a source being connected to an input/output power supply terminal VCCq. The n-channel MOS transistor 1202 has a gate being connected to the input terminal I/O, a source being connected to a ground terminal, and a drain being connected to a drain of the p-channel MOS transistor 1201. An n-channel MOS transistor 1203 has a gate being connected to the input/output power supply terminal VCCq, a drain being connected to the interconnection between the drain of the transistor 1201 and the drain of the transistor 1202, and a source being connected to an inverter 1213.

The inverter 1213 includes a p-channel MOS transistor 1204 and an n-channel MOS transistor 1205. The p-channel MOS transistor 1204 has a gate being connected to the source of n-channel MOS transistor 1203, a source being connected to a power supply terminal VDD, and a drain being connected to an output terminal 1214. The n-channel MOS transistor 1205 has a gate being connected to the source of the n-channel MOS transistor 1203, a source being connected to a ground terminal, and a drain being connected to the output terminal 1214. A p-channel MOS transistor 1206 has a gate being connected to the output terminal 1214, a source being connected to the power supply terminal VDD, and a drain being connected to the source of the n-channel MOS transistor 1203. The output terminal 1214 is connected to the NAND flash memory 105 through the signal line 503 in FIG. 5, or, is connected to the RAM 106 through the signal line 504 in FIG. 5.

Next, the operation of the voltage level conversion circuit 511 will be explained. For example, a voltage of 1.8 V is supplied to the input/output power supply terminal VCCq, and a voltage of 3.0 V is supplied to the power supply terminal VDD. An input signal of 1.8 V level (high level is 1.8 V, low level is 0 V) is input to the input terminal I/O, and an output signal of 3.0 V level (high level is 3.0 V, low level is 0 V) is output from the output terminal 1214. That is, the voltage level conversion circuit 511 converts the input signal of 1.8 V level into the output signal of 3.0 V level.

An input signal of, e.g., 1.8 V level input to the input terminal I/O is input to the inverter 1212. The inverter 1212 inverts the input signal logically and outputs a signal of 1.8 V level. The signal output from the inverter 1212 is input to the inverter 1213 through the n-channel MOS transistor 1203. The inverter 1213 inverts the input signal logically and outputs. For example, the inverter 1213 outputs a signal of low level if the input signal is high level (1.8 V). Then, the p-channel MOS transistor 1206 outputs high level (3.0 V). The output of high level (3.0 V) is fed back to the input of the inverter 1213. As a result, the output of the inverter 1213 is fixed at low level. At this time, since the n-channel MOS transistor 1203 becomes off with the gate voltage 1.8 V (VCCp), it prevents the current from running into the input/output power supply terminal (VCCq) of the inverter 1212. Conversely, if an output signal of the inverter 1212 is low level, the inverter 1213 outputs high level (3.0 V) to the output terminal 1214. In this way, a voltage conversion of different voltage levels can be performed. This also applies for the voltage level conversion circuit 611 in FIG. 6.

Figure 13:
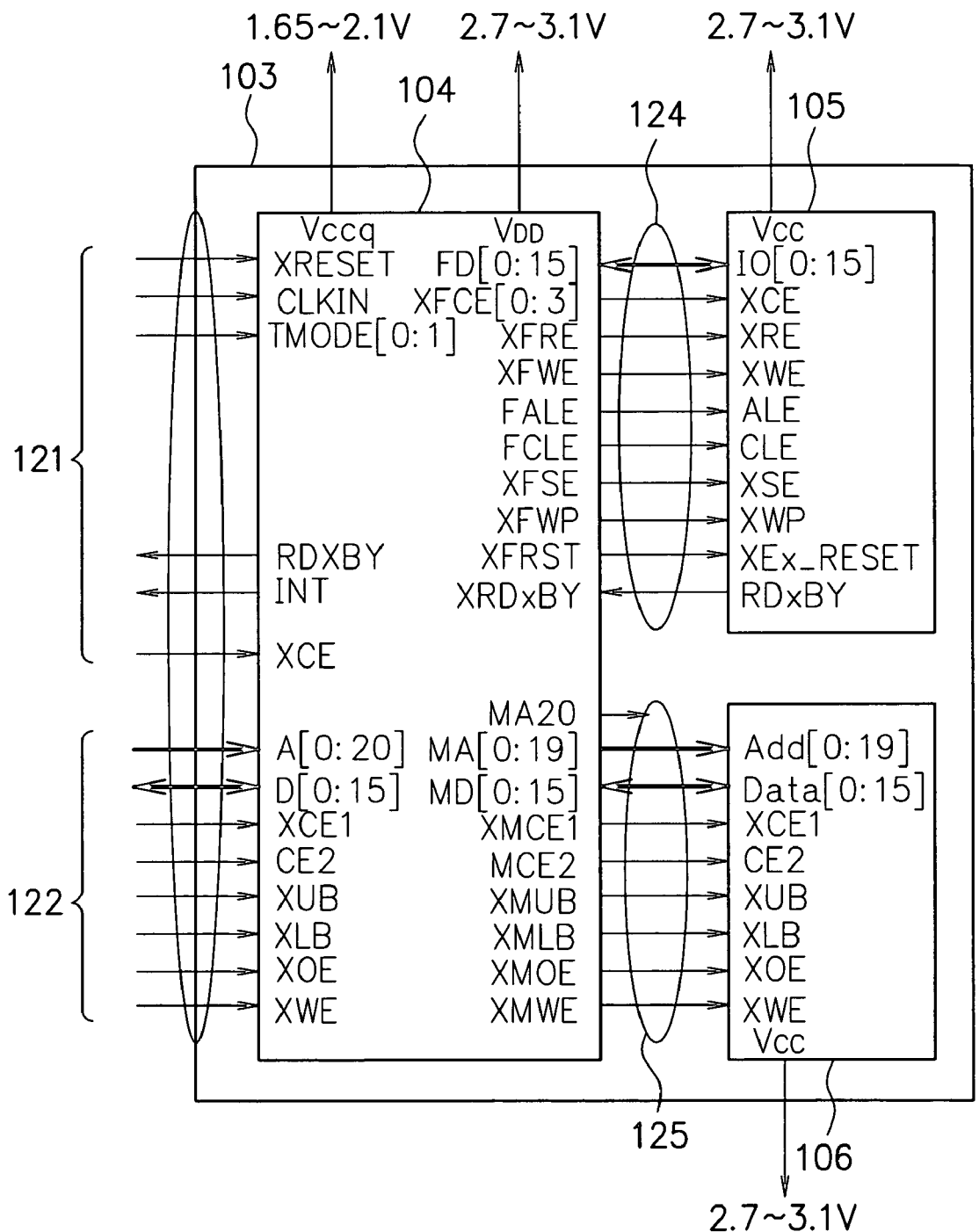
FIG. 13 is a representation of a method of testing a NAND flash memory.

FIG. 13 is a representation of a method of testing the NAND flash memory 105. The construction of FIG. 13 differs from that of FIG. 3 in that a test mode terminal TMODE is added to the internal controller 104. When a test of the memory device 103 is carried out, in case that the NAND flash memory 105 has no external terminal (pin) as in FIG. 3, the test of the NAND flash memory 105 by itself may lack reliability.

With the memory device 103 in FIG. 13, the two bits of a test mode signal can be input to the test mode terminal TMODE. The test mode terminal TMODE that is an external terminal of the memory device 103 is asserted, thereby, the terminal of the NAND flash memory 105 can be assigned to an external terminal of the internal controller 104 (i.e., the external terminal of the memory device 103). Accordingly, with using the external terminal, it is possible to carry out a test of the NAND flash memory 105 by itself as well as general NAND flash memories.

The internal controller 104 has the internal terminals, e.g., FD, the external terminals, e.g., A which can be connected with the outside, and the test mode (assign) terminal TMODE for externally receiving a test mode signal (an assign signal). The internal terminals, e.g., FD of the internal controller 104 are connected to the terminals, e.g., IO of the NAND flash memory 105. When the test mode signal is input to the test mode terminal TMODE, the internal controller 104 assigns the internal terminals, e.g., FD for the external terminals, e.g., A. More specifically, the internal terminals, e.g., FD are connected with the corresponding external terminals, e.g., A respectively. These external terminals are substantially the same as the terminals of the NAND flash memory 105, therefore, a test can be carried out as well as the case that the external terminals are directly connected to the terminals of the NAND flash memory 105.

Power supply levels in FIG. 13 will be explained next. The power supply levels are applied as in the case of FIG. 5. The internal controller 104 supplies a power supply voltage of 1.65 to 2.1 V to the input/output power supply voltage terminal VCCq, and supplies a power supply voltage of 2.7 to 3.1 V to the power supply voltage terminal VDD. The NAND flash memory 105 supplies a power supply voltage of 2.7 to 3.1 V to the power supply voltage terminal VCC. The RAM 106 also supplies a power supply voltage of 2.7 to 3.1 V to the power supply voltage terminal VCC.

FIG. 7 shows another data transfer method between the NAND flash memory 105 and the RAM 106. The NAND flash memory 701 has pages 702, 703, 704, and so on. Each of the pages 702 to 704 has an actual data area and a spare data area. The actual data area is for storing actual data, and the spare data area is for storing spare data (including control information, management method, and error detection and correction data). In each page, the actual data area is for, e.g., 512 words and the spare data area is for, e.g., 16 words. For the spare data area, the first eight words form an area for storing control information and management information, and the second eight words form an area for storing error detection and correction data. In this embodiment, a RAM 711 also has an actual data area 712 and a spare data area 713.

Data transfer from the NAND flash memory 701 to the RAM 711 will be described first. The NAND flash memory 701 stores actual data and spare data. A microcontroller 721 decomposes and reads out actual data 731 and spare data 732 from the NAND flash memory 701. The actual data 731 is written in the actual data area 712 of the RAM 711 as actual data 712a, 712b, and 712c. The spare data 732 is written in the spare data area 713 of the RAM 711 as spare data 713a, 713b, and 713c. The actual data 712a, 712b, and 712c and the spare data 713a, 713b, and 713c are in a one-to-one correspondence for each page.

Each of the spare data 713a to 713c includes data of eight words for control information and management information and need not always include error detection and correction data. The error detection and correction data is generated by the error detection and correction circuit 113 (FIG. 1) and therefore need not be stored in the RAM 711.

The spare data includes information on the number of times of write, the number of times of erase, and the like and therefore must be changed when the actual data 712a to 712c are to be written in the NAND flash memory 701 again. To correct the actual data 712a to 712c on the RAM 711, the spare data 713a to 713c must also be corrected accordingly. The microcontroller 721 changes the spare data 713a to 713c on the RAM 711.

Data transfer from the RAM 711 to the NAND flash memory 701 will be described next. The actual data 712a to 712c and the spare data 713a to 713c on the RAM 711, which are changed at need, are linked in a one-to-one correspondence for each page and written in the NAND flash memory 701.

Figure 11:
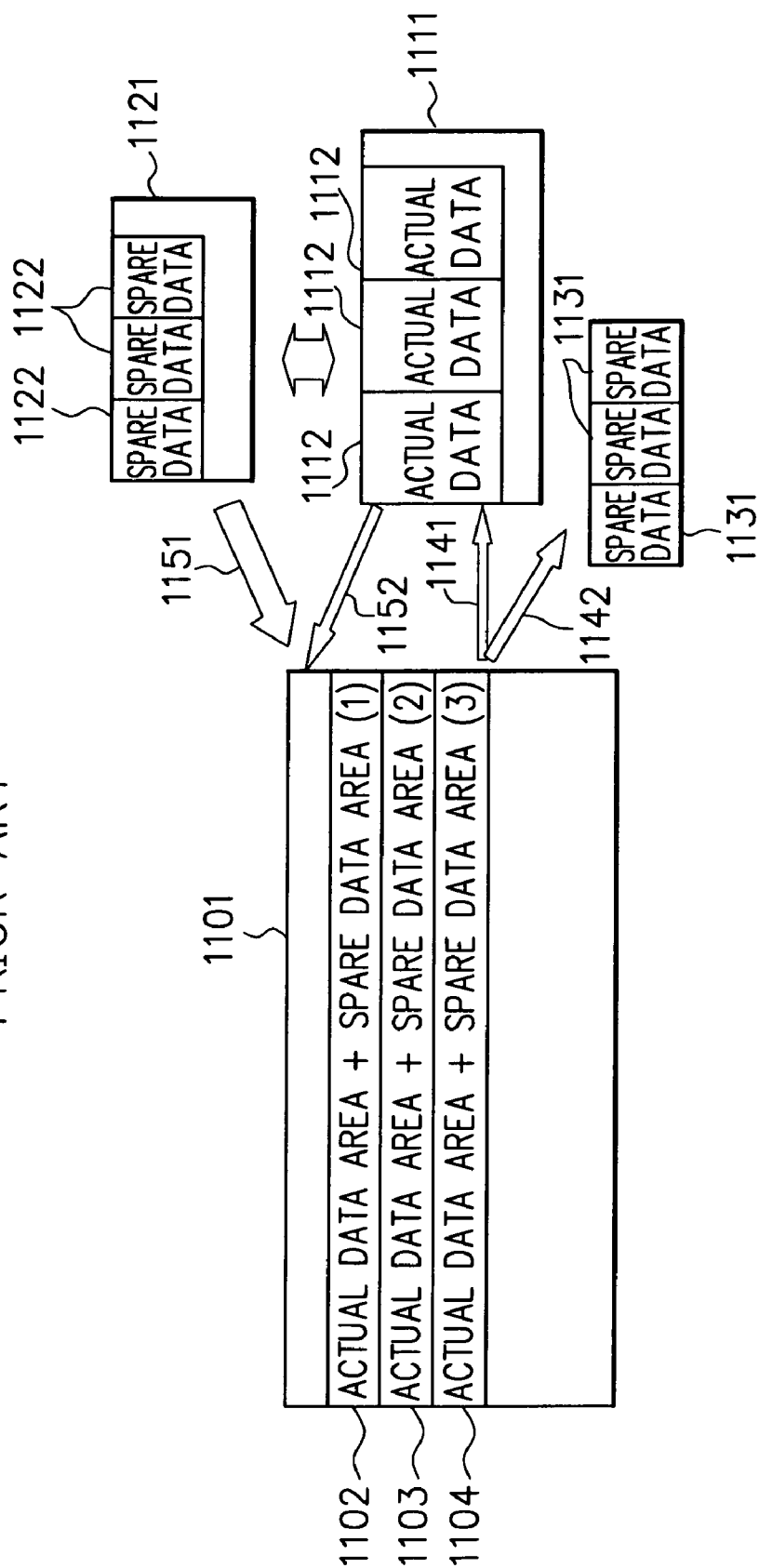
FIG. 11 is a representation of a conventional data transfer method between a NAND flash memory and a RAM.

According to the prior art shown in FIG. 11, when the microcontroller 1121 is going to correct data on the RAM 1111 and write the data in the NAND flash memory 1101, spare data is temporarily read out from the NAND flash memory 1101 and corrected. The microcontroller 1121 writes the corrected spare data and the corrected actual data on the RAM 1111 in the NAND flash memory 1101. Since the spare data must be temporarily read out from the NAND flash memory 1101, the number of processing steps is large, and the processing speed is low.

According to this embodiment, since spare data need not be particularly read out from the NAND flash memory 701, the number of processing steps decreases, and the processing speed becomes high.

The actual data area 712 and the spare data area 713 of the RAM 711 are provided as continuous address areas, while the actual data area and the spare data area of the NAND flash memory 701 are provided as discontinuous address areas.

The spare data register 206 shown in FIG. 2 will be described next. In the spare data 713*a* to 713*c* on the RAM 711, a predetermined number of data having the same contents may repeat. For example, when spare data is used as data representing the name of actual data, two or more pages may have identical spare data. In this case, the plurality of spare data having the same contents are stored in the spare data register 206 as single spare data, the number of repeated data is stored in the data size register 204, and the source address and the destination address are stored in the source address register 202 and the destination address register 203, respectively. In addition, information indicating the use of the spare data register 206 is stored in the spare set register 207.

The internal controller 104 then links the actual data 712*a* to 712*c* in the actual data area 712 of the RAM 711 and the spare data in the spare data register 206 and writes the data in the actual data area and the spare data area of the NAND flash memory 701, respectively.

To change the spare data 713*a* to 713*c* having the same contents on the RAM, all the spare data 713*a* to 713*c* must be changed. Contrastingly, when the single spare data having the same contents is stored in the spare data register 206, it suffices to correct only the single spare data in the spare data register 206. For this reason, processing is simplified, and the processing speed becomes high.

The spare data register 206 is a register for storing one or more spare data. When a plurality of spare data to be written in the NAND flash memory 701 have the same contents, the internal controller 104 can write the plurality of spare data having the same contents in the NAND flash memory 701 using single spare data in the spare data register 206.

The spare set register 207 shown in FIG. 2 is a register used to select the spare data in the spare data register 206 or one of the spare data 713*a* to 713*c* in the RAM 711 and write the selected data in the NAND flash memory 701.

Figure 8:
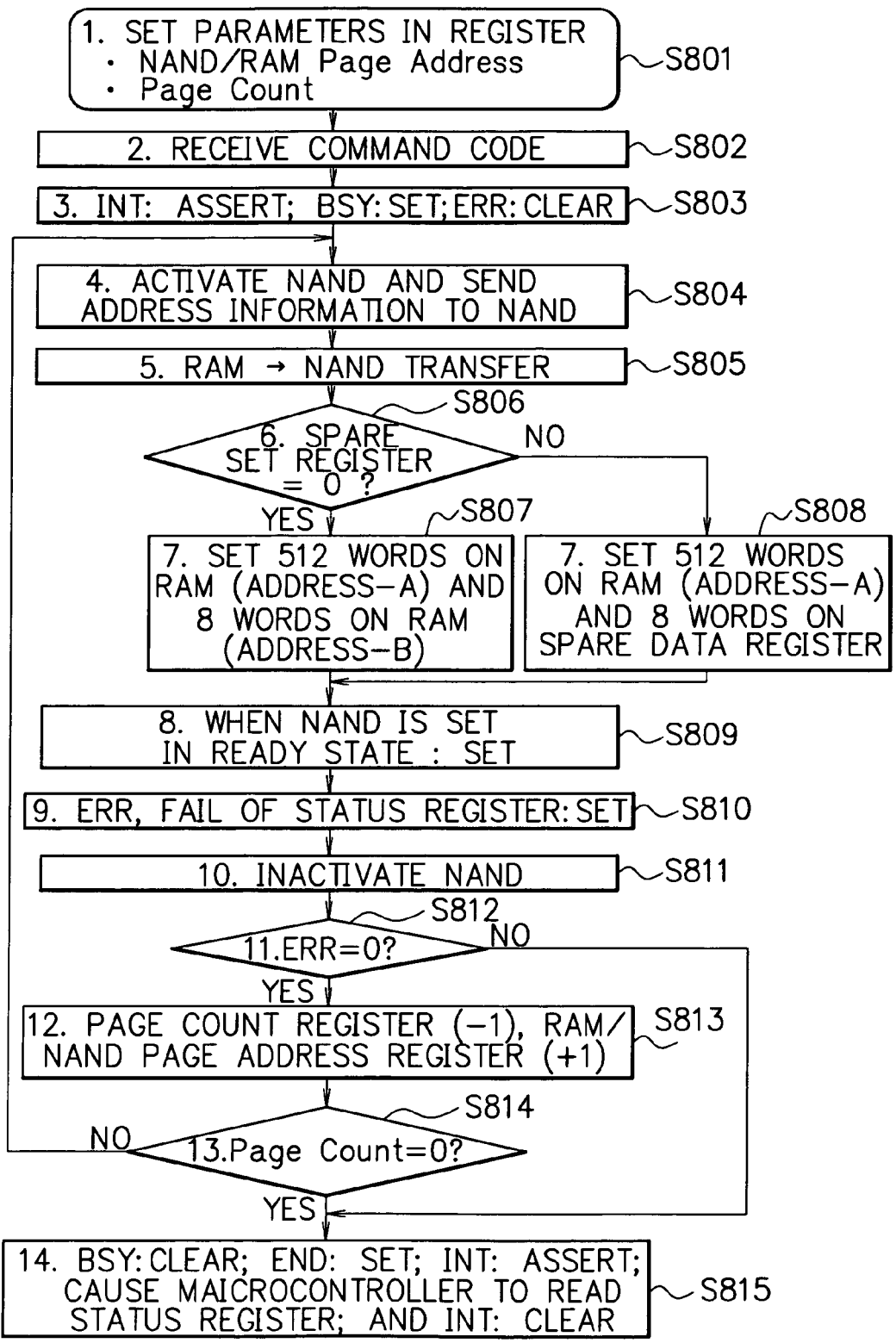
FIG. 8 is a flowchart showing save processing from the NAND flash memory to the RAM according to the embodiment.

FIG. 8 is a flowchart showing processing of a save command from the RAM 711 to the NAND flash memory 701.

In step S801, parameters are set in the registers. For example, the page addresses of the NAND flash memory and the RAM are set, and the number of pages is set. In step S802, a command code is set to the command register. In step S803, an interrupt signal INT is asserted, a busy signal BSY is set, and an error signal ERR and an end signal END are cleared.

In step S804, the NAND flash memory is activated and address information is sent to the NAND flash memory. In step S805, an instruction to transfer data from the RAM to the NAND flash memory is made.

In step S806, it is checked whether or not the spare set register is 0. If YES in step S806, the flow advances to step S807; otherwise, the flow advances to step S808.

In step S807, actual data of 512 words on the actual data area of the RAM and spare data of 8 words on the spare data area of the RAM are set, and the flow advances to step S809.

In step S808, actual data of 512 words on the actual data area of the RAM and spare data of 8 words on the spare data register are set, and the flow advances to step S809.

In step S809, when the NAND flash memory is set in the ready state, the status of the NAND flash memory is read out. In step S810, an error flag ERR and a fail flag FAIL of the status register are set. In step S811, the NAND flash memory is inactivated. In step S812, it is checked whether or not the error flag ERR is 0. If YES in step S812, the flow advances to step S813; otherwise, the flow advances to step S815.

In step S813, the page count register is decremented, and the page addresses of the RAM and the NAND flash memory are incremented. In step S814, it is checked whether or not the number of pages is 0. If YES in step S814, the flow advances to step S815; otherwise, the flow returns to step S804 to repeat save processing for the next page.

In step S815, the busy signal BSY is cleared, the end signal END is set, and the interrupt signal INT is asserted. When the microcontroller reads the status register, the interrupt signal INT is cleared. The save processing is then ended.

As described above, when the spare set register 207 (FIG. 2) is 0, the actual data of 512 words on the RAM and the spare data of 8 words on the RAM are written in the NAND flash memory in step S807. contrastingly, when the spare set register 207 is 1, the actual data of 512 words on the RAM and the spare data of 8 words on the spare data register are written in the NAND flash memory in step S808. Either save method can be selected in accordance with the setting of the spare set register 207.

In this embodiment, even during data transfer between the NAND flash memory 105 and the RAM 106, the NOR flash memory 102 can be accessed. That is, the controller can execute data transfer between the nonvolatile memory and the volatile memory in response to an instruction from an external controller. During this data transfer, the external bus is not occupied. Hence, the external controller can access another memory (e.g., a NOR flash memory) through the external bus even during the data transfer. In addition, the external controller can make a pseudo access as if the volatile memory were directly accessed through the controller according to the present invention.

Data transfer between the NAND flash memory 105 and the RAM 106 can be performed at a high speed.

The buffer capacity of the data latch 115 in the internal controller 104 for controlling data transfer between the NAND flash memory 105 and the RAM 106 can be made small.

The electrical specification of the microcontroller 101 can be determined independently of the electrical specifications of the NAND flash memory 105 and the RAM 106.

By providing the spare data area 713 in the RAM 711 of FIG. 7, spare data can be written in the NAND flash memory 701 at a high speed.

The memory device according to this embodiment can be applied to a portable telephone which processes stream data of image information or music information as actual data, and also can be suitably used to store stream data in the NAND flash memory.

The above embodiment is a mere example of the present invention and should not be construed to limit the technical scope of the present invention. That is, the present invention can be practiced in various forms without departing from its technical spirit and scope or major features.

What is claimed is:

1. A memory device, comprising:
a nonvolatile memory connected to a first memory bus and capable of storing data received thereby through said first memory bus;
a volatile memory connected to a second memory bus and capable of being random-accessed through said second memory bus; and
a controller having a first internal terminal connected to said first memory bus, a second internal terminal connected to said second memory bus, and an external terminal connected to an external bus, said controller transferring data between said nonvolatile memory and said volatile memory through said first and second internal terminals, said controller including a register capable of storing a source address, a destination address, and a size of data to be transferred, wherein;
when the data transfer is not performed, said controller controls to access from an exterior to said volatile memory through said external terminal and said second internal terminal, in accordance with an instruction through said external bus, and
said controller performs error detection and/or correction processing in said data transfer.

2. The memory device according to claim 1, wherein said controller performs data transfer between said volatile memory and said nonvolatile memory in accordance with an external instruction without affecting said external bus.

3. The memory device according to claim 2, wherein said controller notifies said external bus of an end of the data transfer by an interrupt.

4. The memory device according to claim 1, wherein said controller temporarily stops the data transfer by a suspend command in a data transfer between said nonvolatile memory and said volatile memory, accesses said volatile memory in accordance with an external instruction, and then resumes the data transfer by a resume command.

5. The memory device according to claim 1, wherein said nonvolatile memory, said volatile memory, and said controller are incorporated in a single package.

6. The memory device according to claim 1, wherein said controller is capable of starting writing a plurality of data units in said volatile memory or said nonvolatile memory before said plurality of data units have been completely read out from said nonvolatile memory or said volatile memory in data transfer between said nonvolatile memory and said volatile memory.

7. The memory device according to claim 6, wherein said controller starts writing a plurality of data units in said volatile memory before said plurality of data units have been completely read out from said nonvolatile memory in data transfer from said nonvolatile memory to said volatile memory.

8. The memory device according to claim 6, wherein said controller starts writing a plurality of data units in said nonvolatile memory before said plurality of data units have been completely read out from said volatile memory in data transfer from said volatile memory to said nonvolatile memory.

9. The memory device according to claim 6, wherein said controller reads out actual data and error detection and correction data from said nonvolatile memory, performs error detection and/or correction processing for said actual data on the basis of said error detection and correction data, and writes said actual data in said volatile memory, in data transfer from said nonvolatile memory to said volatile memory.

10. The memory device according to claim 6, wherein said controller reads out actual data from said volatile memory, generates error detection and correction data on the basis of said actual data, and writes said actual data and said error detection and correction data in said nonvolatile memory, in data transfer from said volatile memory to said nonvolatile memory.

11. The memory device according to claim 6, wherein said controller further comprises an error detection and correction register storing error detection and correction information.

12. The memory device according to claim 11, wherein said error detection and correction register stores an address of data from which an error has been detected.

13. The memory device according to claim 6, wherein said controller further comprises a buffer buffering data and performing said data transfer through said buffer.

14. The memory device according to claim 13, wherein said controller performs said data transfer in a time interval obtained by adding one transfer cycle to a time interval obtained by multiplying a transfer cycle by the number of transfer data.

15. The memory device according to claim 1, wherein said controller reads out actual data, error detection and correction data from said nonvolatile memory, performs error detection for said actual data on the basis of said error detection and correction data writes said actual data in said volatile memory, and performs error correction processing for said actual data on said volatile memory, in data transfer from said nonvolatile memory to said volatile memory.

16. The memory device according to claim 1, wherein said controller includes a memory bus, connected to said nonvolatile and volatile memories, and an external bus, externally connected, said external bus having a single input/output voltage level and said memory bus and said external bus having different input/output voltage level ranges.

17. The memory device according to claim 16, wherein said nonvolatile and volatile memories have different operable input/output voltage level ranges.

18. The memory device according to claim 17, wherein said controller accesses said nonvolatile and volatile memories using an overlap range of the operable input/output voltage levels of said plurality of memories.

19. The memory device according to claim 18, wherein said controller comprises a power supply terminal inputting a power supply voltage at an input/output voltage level within said overlap range and controls input/output voltage levels of said nonvolatile and volatile memories on the basis of a voltage of said power supply terminal.

20. The memory device according to claim 17, wherein said controller accesses said nonvolatile and volatile memories using different input/output voltage levels which do not overlap.

21. The memory device according to claim 20, wherein said controller comprises two power supply terminals inputting power supply voltages at different input/output voltage levels which do not overlap and controls input/output voltage levels of said nonvolatile and volatile memories on the basis of voltages of said two power supply terminals.

22. The memory device according to claim 1 wherein:
said controller has an assign terminal for externally inputting an assign signal; and when the assign signal is input to said assign terminal, said controller performs an assignment between said first internal terminal and said external terminal.

23. The memory device according to claim 20, wherein operable input/output voltage level ranges of said nonvolatile and volatile memories do not overlap.

24. A memory device, comprising:
a nonvolatile memory including an actual data area storing a plurality of actual data units and a spare data area storing a plurality of spare data units;
a volatile memory including an actual data area storing a plurality of actual data units and a spare data area storing a plurality of spare data units; and
a controller for performing data transfer between said nonvolatile memory and said volatile memory.

25. The memory device according to claim 24, wherein each of said spare data units includes one of control information and management information.

26. The memory device according to claim 24, wherein said plurality of actual data units and said plurality of spare data units are in a one-to-one correspondence.

27. The memory device according to claim 26, wherein said controller decomposes actual and spare data units which have been correspondingly read out from said actual data area and said spare data area in said nonvolatile memory, and writes the discomposed actual and spare data units respectively in said actual data area and said spare data area in said volatile memory, in data transfer from said nonvolatile memory to said volatile memory.

28. The memory device according to claim 26, wherein said controller includes a first write controller linking actual and spare data units which have been correspondingly read out from said actual data area and said spare data area in said volatile memory, and writing the linked actual and spare data units respectively in said actual data area and said spare data area in said nonvolatile memory, in data transfer from said volatile memory to said nonvolatile memory.

29. The memory device according to claim 28, wherein said controller further comprises a second write controller including a spare data register storing one or more spare data units, said second write controller linking an actual data unit in said actual data area in said volatile memory and a spare data unit in said spare data register and writing the linked actual and spare data units respectively in said actual data area and said spare data area in said nonvolatile memory.

30. The memory device according to claim 29, wherein said controller selects which of said first and second write controllers is used to write.

31. The memory device according to claim 26, wherein said controller includes a spare data register storing one or more spare data units, links an actual data unit in said actual data area in said volatile memory and a spare data unit in said spare data register, and writes the linked actual and spare data units, respectively in said actual data area and said spare data area, in said nonvolatile memory.

32. The memory device according to claim 31, wherein said spare data register stores one spare data unit.

33. The memory device according to claim 31, wherein said controller writes a plurality of spare data units in said nonvolatile memory using one spare data unit in said spare data register when said plurality of spare data units have the same contents.

34. The memory device according to claim 24, wherein said actual data area and said spare data area in said volatile memory are provided as continuous address areas.

35. The memory device according to claim 34, wherein said actual data area and said spare data area in said nonvolatile memory are provided as discontinuous address areas.

* * * * *